(12) United States Patent
Mutou

(10) Patent No.: US 6,855,940 B2
(45) Date of Patent: Feb. 15, 2005

(54) CHARGED PARTICLE MICROSCOPE

(75) Inventor: Hiroto Mutou, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 0 days.

(21) Appl. No.: 10/395,672

(22) Filed: Mar. 24, 2003

(65) Prior Publication Data

US 2003/0183775 A1 Oct. 2, 2003

(30) Foreign Application Priority Data

Mar. 26, 2002 (JP) ........................................ 2002-086332

(51) Int. Cl.⁷ .............................................. H01J 37/20
(52) U.S. Cl. .............................. 250/440.11; 250/442.11
(58) Field of Search .................................... 250/440.11

(56) References Cited

U.S. PATENT DOCUMENTS 5,734,164 A * 3/1998 Sanford ....................... 250/310
6,407,373 B1 * 6/2002 Dotan ....................... 250/201.3

* cited by examiner

Primary Examiner—John R. Lee
Assistant Examiner—Phillip Johnston
(74) Attorney, Agent, or Firm—Adams & Wilks

(57) ABSTRACT

In a charged particle microscope equipped with a sample stage having an inclination function, the invention provides a construction that prevents inclination driving of the sample stage from affecting other peripheral devices to be additionally installed such as an optical microscope. In the charged particle microscope according to the invention, a sample stage having an inclination mechanism includes a rotation support portion of the inclination mechanism on sidewalls of a vacuum chamber, and at least a detection portion of other peripheral devices additionally installed such as (1) an optical microscope, (2) a laser scattering microscope and (3) an optical height detection system is fitted to the rotation support portion inside the chamber in such a fashion as to be capable of moving with a rotary shaft of the inclination mechanism, and members that cannot be arranged in vacuum are installed outside the chamber.

4 Claims, 2 Drawing Sheets

CHARGED PARTICLE MICROSCOPE

BACKGROUND OF THE INVENTION

1. Field of the Invention

This invention relates to a charged particle microscope such as an electron microscope equipped with an optical microscope, a laser scattering microscope or an optical height detection system.

2. Description of the Related Art

In a charged particle microscope such as an electron microscope or an ion microscope, a sample is generally placed on a multi-axes stage for achieving X-Y-Z three-dimensional driving for positioning relative to the microscope, rotation driving, inclination driving, and so forth, in order to observe a specific portion of the sample from a desired angle, to process the sample and to observe the sample while its position and posture can be freely changed. In the electron microscope, an optical microscope or a laser scattering microscope is additionally installed (1) to index a reference height of a sample surface, (2) to observe a surface in an optical image and (3) to conduct position indexing observation of very fine cracks and foreign matters, and the sample surface is observed separately from the observation operation by the charged particle microscope. In the electron microscope equipped additionally with the optical microscope or the laser scattering microscope, some of components and devices used for the electron microscope are not so designed as to cope with use in vacuum or cannot be put into vacuum for the reason of their materials. Because all of these members and devices cannot be arranged inside the sample chamber that must be kept in vacuum, observation is conducted while they are fitted to fixed portions such as sidewalls of the chamber.

FIG. 3 shows an example of an electron microscope that employs such a construction. In the drawing, reference numeral 1 denotes a body tube of an electron microscope. Reference numeral 2 denotes a vacuum chamber. Reference numeral 3 denotes a sample stage. Reference numeral 4 denotes a rotation mechanism. Reference numeral 5 denotes a Z-axis driving mechanism. Reference numeral 6 denotes a Y-axis driving mechanism. Reference numeral 7 denotes an X-axis driving mechanism. Reference numeral 8 denotes an inclination mechanism that is supported at an eccentric position of a rotary shaft mechanism 9 fitted to a sidewall of the vacuum chamber 2. The system further includes an optical microscope 10 for observing a sample surface separately from the electron microscope, fitted to a sidewall of the chamber 2. Reference numeral 11 in the drawing denotes a CCD camera for converting an image of the optical microscope 10 to electronic image information. FIG. 4 shows an example of a system including a laser level meter for indexing a reference height of the sample surface, provided to the electron microscope. In the same way as the example shown in FIG. 3, reference numeral 1 denotes a body tube of an electron microscope, reference numeral 2 denotes a vacuum chamber, reference numeral 3 denotes a sample stage and reference numeral 4 denotes a rotation mechanism. Although not shown in FIG. 4, the system also includes a Z-axis driving mechanism, a Y-axis driving mechanism, an X-axis driving mechanism, and an inclination mechanism in the same way as the example in FIG. 3. However, the system shown in FIG. 4 is different from the system shown in FIG. 3 in that a laser projector 12 and a laser receiver 13 serving as a laser level meter are fitted to the chamber 2 instead of the optical microscope shown in FIG. 3.

When the system described above is used for conducting foreign matter adhesion inspection of a semiconductor wafer, for example, the sample stage 3 is sometimes inclined so as to observe the sample from slantingly above and to classify defects. When this inclination driving of the sample stage 3 is made, it is necessary to prevent the position of the defect to be observed from deviating and coming off from the visual field of the microscope due to the driving operation. The center of the observation point by the microscope exists at the point of intersection between the optical axis of the microscope and the sample surface. In the related art example described above, the rotary shaft of the rotary shaft mechanism 9 supporting the inclination mechanism 8 is set so that its level is coincident with the sample surface lest the center position varies with the inclination driving operation. According to this construction, the crossing point of the surface with the optical axis of the electro-optical system does not move even when the inclination mechanism 8 changes the inclination of the sample surface. In the example shown in FIG. 3, however, the optical microscope 10 is fixedly installed to the chamber 2. Consequently, the sample surface inclines relative to this optical microscope 10, too and the problems arise in that (1) observation becomes impossible, (2) the observation point changes, (3) the observation condition changes, and so forth. In the example shown in FIG. 4, the measurement position of the laser level meter does not change but the direction of height changes due to inclination of the sample surface, affecting adversely the level measurement.

SUMMARY OF THE INVENTION

In a charged particle microscope equipped with a sample stage having an inclination function, an advantage of the invention to provide a mechanism that prevents inclination driving of the sample stage from affecting other peripheral devices additionally installed, such as an optical microscope.

In the charged particle microscope according to the invention, a sample stage having an inclination mechanism includes a rotation support portion of the inclination mechanism on sidewalls of a vacuum chamber, and at least a detection portion of other peripheral devices additionally installed such as (1) an optical microscope, (2) a laser scattering microscope and (3) an optical height detection system is fitted to the rotation support portion inside the chamber in such a fashion as to be capable of moving with a rotary shaft of the inclination mechanism, and members that cannot be arranged in vacuum are installed outside the chamber.

DETAILED DESCRIPTION OF THE INVENTION

In order to accomplish a construction that prevents inclination driving of a sample stage from affecting other peripheral devices additionally installed such as an optical microscope, a laser scattering microscope and an optical height detection system in a charged particle microscope equipped with the sample stage having an inclination function, the invention is based on the concept that rotation of a rotation support portion for inclining the sample stage is allowed to operate in the interlocking arrangement with the peripheral devices and to prevent the occurrence of relative displacement in relation to the sample surface.

In the charged particle microscope according to the invention, the sample stage having the inclination mechanism includes a rotation support portion of the inclination mechanism on the sidewalls of the vacuum chamber, at least a detection portion of other peripheral devices additionally installed such as an optical microscope, a laser scattering microscope or an optical height detection system is arranged and fitted to the rotation support portion inside the vacuum chamber and is allowed to move with a rotary shaft of the inclination mechanism. Those members that cannot be arranged in vacuum because some of components and devices used are not so designed as to withstand vacuum such as CCD camera or for the reason of their materials are installed outside the chamber. According to such a construction, at least the detection portion of other peripheral devices arranged inside the chamber can be driven for rotation in the interlocking arrangement with inclination driving of the sample stage. Therefore, even when the sample stage is driven and inclined during the operation of the charged particle microscope, the positional relationship between the detection portion of the peripheral device and the sample surface remains unaltered and no influences are exerted on the data detected.

EMBODIMENT 1

Figure 1:
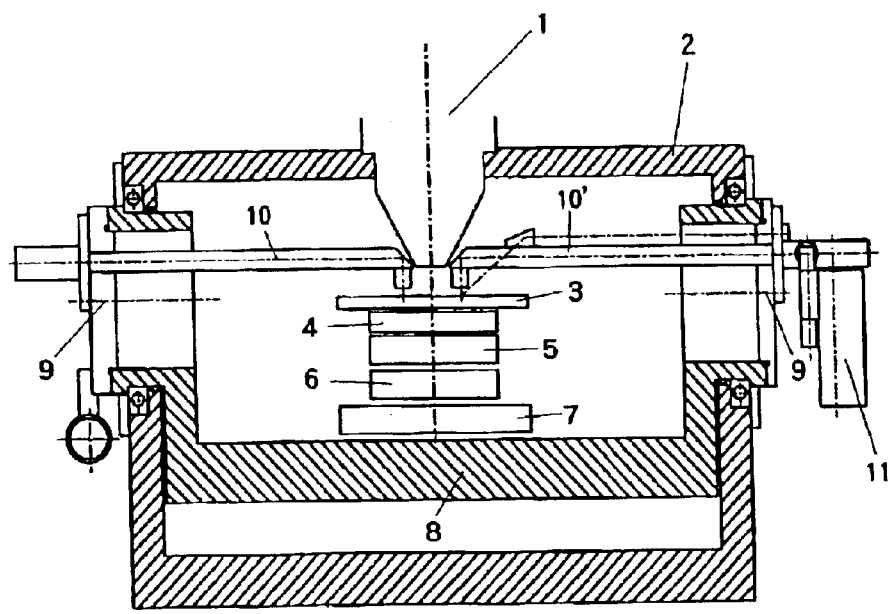
FIG. 1 shows a first embodiment of the invention.
Figure 3:
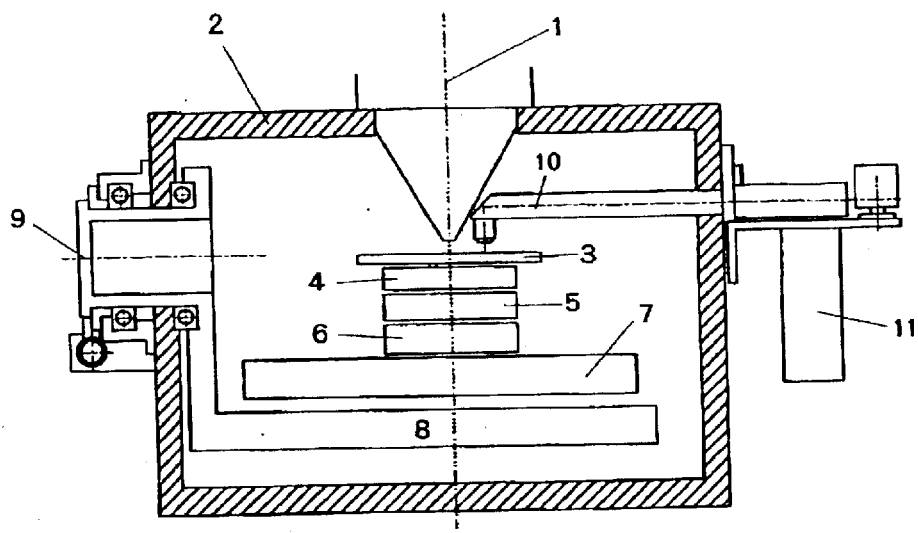
FIG. 3 shows an example of a sample stage inclination mechanism in a charged particle microscope having a peripheral device according to the related art.

FIG. 1 shows a first embodiment of the invention. In the drawing, reference numeral 1 denotes a body tube of an electron microscope. Reference numeral 2 denotes a vacuum chamber. Reference numeral 3 denotes a sample stage. Reference numeral 4 denotes a rotation mechanism. Reference numeral 5 denotes a Z-axis driving mechanism. Reference numeral 6 denotes a Y-axis driving mechanism. Reference numeral 7 denotes an X-axis driving mechanism. Reference numeral 8 denotes an inclination mechanism that is supported at an eccentric position of a rotary shaft mechanism 9 fitted to a sidewall of the chamber 2. This construction is the same as that of the related art example shown in FIG. 3. The system according to the invention includes two optical microscopes for observing a sample surface besides the electron microscope. One of the optical microscopes is a light field type optical microscope 10 and the other is a dark field type optical microscope 10' for detecting foreign scattered light. An important construction of the invention resides hereby in that the light field optical microscope 10 and the dark field type microscope 10' are fitted to the rotary shaft mechanism 9 on the sidewalls of the chamber but not in that these two optical microscopes are disposed. Because this construction is employed, the observation images of both light and dark field type optical microscopes 10 and 10' remain unaltered relative to the sample surface even when the sample stage 3 is driven and inclined in a direction of both surfaces of the sheet of the drawing, and can keep the same image. In this embodiment, a CCD camera denoted by reference numeral 11 is arranged outside the chamber 2, but is also fitted to the rotary shaft mechanism 9 and rotates in the interlocking arrangement. The CCD camera itself as a light reception portion must operate integrally with the detection portion, but a subsequent signal processing portion may be connected through signal lines and may be installed at a stationary portion. This construction can be employed advantageously when the apparatus becomes greater in scale and applies an excessive load to the rotary shaft mechanism 9.

EMBODIMENT 2

Figure 2:
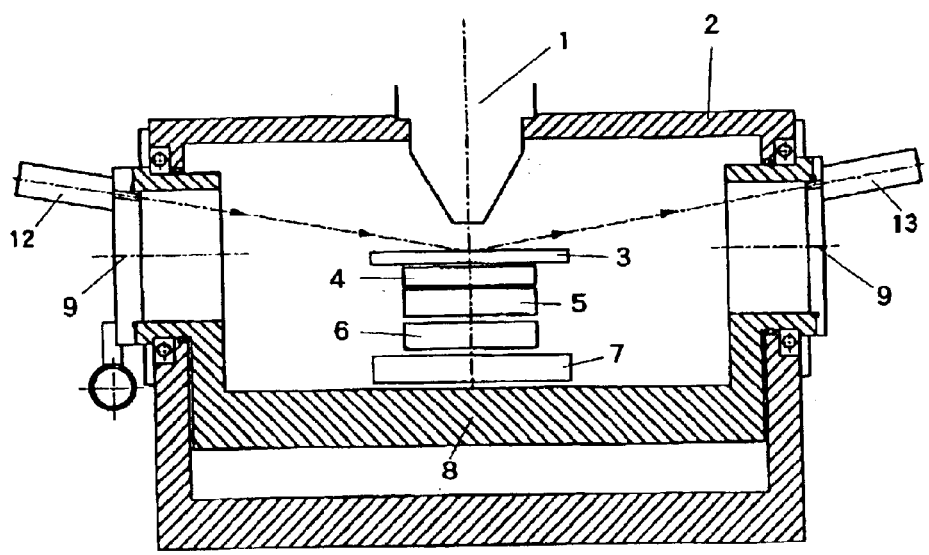
FIG. 2 shows a second embodiment of the invention.
Figure 4:
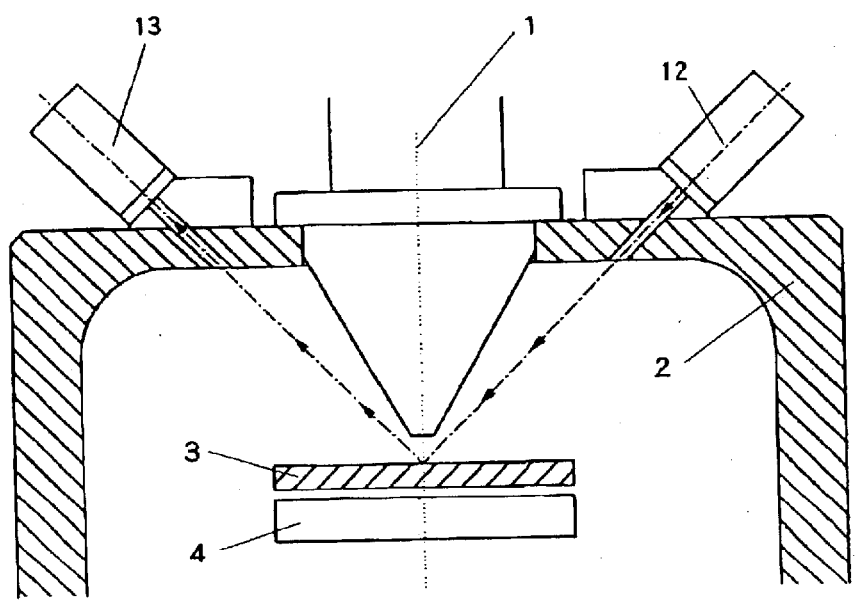
FIG. 4 shows another example of the sample stage inclination mechanism in the charged particle microscope having a peripheral device according to the related art.

FIG. 2 shows a second embodiment of the invention. In the drawing, reference numeral 1 denotes a body tube of an electron microscope. Reference numeral 2 denotes a vacuum chamber. Reference numeral 3 denotes a sample stage. Reference numeral 4 denotes a rotation mechanism. Reference numeral 5 denotes a Z-axis driving mechanism. Reference numeral 6 denotes a Y-axis driving mechanism. Reference numeral 7 denotes an X-axis driving mechanism. Reference numeral 8 denotes an inclination mechanism that is supported at an eccentric position of a rotary shaft mechanism 9 fitted to a sidewall of the chamber 2. This construction is the same as that of the first embodiment shown in FIG. 1. In this system, optical height detection systems for detecting a position of a sample surface are arranged separately from the electron microscope for observing the sample surface. One of the detection systems is a laser projector 12 and the other, a laser receiver 13. The difference of this embodiment from the related art apparatus shown in FIG. 4 is that both of the two members, that is, the laser projector 12 and the laser receiver 13, are directly fitted to the rotary shaft mechanism 9 of the sidewalls of the camber 2. Because this construction is employed, the incidence angle of the laser beam and its reflection angle relative to the sample surface do not vary in the optical height detection system even when the sample stage 3 is driven and inclined. In consequence, detection of the same height component can be maintained.

In the electron microscope equipped with the sample stage having the inclination mechanism, the electron microscope according to the invention includes the rotation support portion of the inclination mechanism on the sidewalls of the vacuum chamber, and other peripheral devices to be additionally arranged are fitted to the rotation support portion and are allowed to move with the rotary shaft of the inclination mechanism. Therefore, other peripheral devices can detect the sample independently of inclination/driving of the sample stage, and even when the sample stage is driven and inclined during observation by the electron microscope, other peripheral devices can conduct detection while keeping the original condition.

At least the detection portion of other peripheral devices to be additionally arranged is fitted to the rotation support portion inside the chamber and is allowed to move with the rotary shaft of the inclination mechanism. When those members that cannot be arranged in vacuum are disposed outside the chamber under this condition, the optical system inside the vacuum chamber and the constituent components in air can keep mechanical interlocking performance.

Among other peripheral devices arranged outside the chamber, the members that are not directly associated with detection may be connected to the detection portion through the signal lines but need not be operated in the interlocking arrangement. Therefore, when a construction in which the members not directly associated with detection are installed as a separate structure to the fixed portion is employed, an over-load to the rotary shaft mechanism 9 can be prevented.

What is claimed is:

1. A charged particle apparatus comprising: a vacuum chamber; a sample stage provided in the vacuum chamber for supporting a sample; a charged particle beam source for irradiating a charged particle beam toward the sample stage;

an inclination mechanism provided in the vacuum chamber for varying an angle of inclination of the sample stage; and a laser level meter comprising a laser projector and a laser reciever fitted to the vacuum chamber for indexing a reference height of a sample surface provided in the vacuum chamber and mounted to the inclination mechanism to undergo inclination movement therewith to maintain a constant position relative to the sample independent of an inclination angle of the sample stage.

2. A charged particle microscope comprising: a vacuum chamber; a sample stage having an inclination mechanism provided in the vacuum chamber for supporting a sample; a charged particle barrel attached to an upper wall of the vacuum chamber over the sample stage for irradiating the sample with a charged particle beam used for observation of sample surface characteristics; a rotary shaft mechanism attached to a side wall of the vacuum chamber for angularly displacing the inclination mechanism on an axis thereof to vary an inclination angle of the sample stage; and optical height detecting means comprising a laser projector and a laser receiver mounted to the rotary shaft mechanism to undergo angular displacement along with the rotary shaft mechanism for maintaining a constant position relative to the sample independent of the inclination angle of the sample stage.

3. A charged particle microscope comprising: a vacuum chamber; a sample stage having an inclination mechanism provided in the vacuum chamber for supporting a sample; a charged particle barrel attached to an upper wall of the vacuum chamber over the sample stage for irradiating the sample with a charged particle beam used for observation of sample surface characteristics; a rotary shaft mechanism attached to a side wall of the vacuum chamber for angularly displacing the inclination mechanism on an axis thereof to vary an inclination angle of the sample stage; a rotation mechanism provided in the vacuum chamber for rotating the sample stage; a driving mechanism provided in the vacuum chamber for moving the sample stage along at least one axis; and an optical observation microscope attached to the rotary shaft mechanism to undergo angular displacement along with the rotary shaft mechanism to maintain a constant position relative to the sample independent of the inclination angle of the sample stage.

4. A charged particle microscope according to claim 3; wherein the driving mechanism comprises a z-axis driving mechanism for moving the sample stage along a z-axis direction, a Y-axis driving mechanism for moving the sample stage along a y-axis direction, and an x-axis driving mechanism for moving the sample stage along an x-axis direction.

* * * * *